(12) United States Patent
Holland et al.

(10) Patent No.: US 9,355,920 B2
(45) Date of Patent: May 31, 2016

(54) METHODS OF FORMING SEMICONDUCTOR DEVICES AND FINFET DEVICES, AND FINFET DEVICES

(71) Applicant: Taiwan Semiconductor Manufacturing Company, Ltd., Hsin-Chu (TW)

(72) Inventors: Martin Christopher Holland, Bertem (BE); Matthias Passlack, Huldenberg (BE); Richard Kenneth Oxland, Brussels (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/203,213

(22) Filed: Mar. 10, 2014

(65) Prior Publication Data

US 2015/0255545 A1 Sep. 10, 2015

(51) Int. Cl.
| | |
|---|---|
| *H01L 21/24* | (2006.01) |
| *H01L 21/66* | (2006.01) |
| *H01L 29/66* | (2006.01) |
| *H01L 29/78* | (2006.01) |
| *H01L 29/20* | (2006.01) |
| *H01L 21/324* | (2006.01) |
| *H01L 29/267* | (2006.01) |

(52) U.S. Cl.
CPC ............ *H01L 22/12* (2013.01); *H01L 21/3245* (2013.01); *H01L 29/20* (2013.01); *H01L 29/267* (2013.01); *H01L 29/66795* (2013.01); *H01L 29/785* (2013.01)

(58) Field of Classification Search
CPC ........................... H01L 21/3245; H01L 29/20
USPC .................................................. 438/429, 478
See application file for complete search history.

(56) References Cited

U.S. PATENT DOCUMENTS

| | | | | |
|---|---|---|---|---|
| 5,430,310 | A  * | 7/1995 | Shibasaki et al. .............. | 257/190 |
| 2005/0285098 | A1* | 12/2005 | Fathimulla et al. ............. | 257/20 |
| 2013/0040431 | A1* | 2/2013 | Ye et al. ......................... | 438/285 |
| 2014/0264438 | A1* | 9/2014 | Holland et al. ................ | 257/190 |
| 2014/0327013 | A1* | 11/2014 | Schenk ............ | H01L 21/02381 257/76 |
| 2014/0329374 | A1* | 11/2014 | Rodder et al. ................. | 438/478 |

OTHER PUBLICATIONS

Choquette, K.D., et al., "Low Threshold Voltage Vertical-Cavity Lasers Fabricated by Selective Oxidation," Electronics Letters, vol. 30, Issue 24, 1994, pp. 2043-2044.
Heyns, M. et al., "Advancing CMOS beyond the Si roadmap with Ge and III/V devices," IEEE, Electron Devices Meeting (IEDM), Dec. 5-7, 2011, pp. 13.1.1-13.1.4.
Kim, D-H, et al., "30 nm E-mode InAs PHEMTs for THz and Future Logic Applications," IEEE International Electron Devices Meeting, 2008, pp. 1-4.
Oxland, R., et al., "An Ultralow-Resistance Ultrashallow Metallic Source/Drain Contact Scheme for III-V NMOS," IEEE Electron Device Letters, vol. 33, Issue 4, 2012, pp. 501-503.

(Continued)

*Primary Examiner* — Long K Tran
(74) *Attorney, Agent, or Firm* — Slater Matsil, LLP

(57) ABSTRACT

Methods of forming semiconductor devices and fin field effect transistors (FinFETs), and FinFET devices, are disclosed. In some embodiments, a method of forming a semiconductor device includes forming a barrier material comprising AlInAsSb over a substrate, and forming a channel material of a transistor over the barrier layer.

20 Claims, 5 Drawing Sheets

(56) References Cited

OTHER PUBLICATIONS

Radosavljevic, M., et al., "High-Performance 40nm Gate Length InSb p-channel Compressively Strained Quantum Well Field Effect Transistors for Low-Power (VCC=0.5V) Logic Applications," 2008 IEEE International Electron Devices Meeting, pp. 727-730.

Radosavljevic, M., et al., "Advanced High-K Gate Dielectric for High-Performance Short-Channel In0.7Ga0.3As Quantum Well Field Effect Transistors on Silicon Substrate for Low Power Logic Applications," 2009 IEEE International Electron Devices Meeting, pp. 13.1.1-13.1.4.

Radosavljevic, M et al., "Non-Planar, Multi-Gate InGaAs Quantum Well Field Effect Transistors with High-K Gate Dielectric and Ultra-Scaled Gate-to-Drain/Gate-to-Source Separation in Low Power Logic Applications," IEEE, Electron Devices Meeting (IEDM), Dec. 6-8, 2010, pp. 6.1.1-6.1.4.

Radosavljevic, G. et al., "Electrostatics Improvement in 3-D Tri-gate Over Ultra-Thin Body Planar InGaAs Quantum Well Field Effect Transistors with High-K Gate Dielectric and Scaled Gate-to-Drain/Gate-to-Source Separation," IEEE, Electron Devices Meeting (IEDM), Dec. 5-7, 2011, pp. 33.1.1-33.1.4.

Van Dal, M.J.H. et al., "Demonstration of scaled Ge p-channel FinFETs integrated on Si," IEEE, Electron Devices Meeting (IEDM), Dec. 10-13, 2012, pp. 23.5.1-23.5.4.

Yuan, Z., et al., "InGaSb: Single Channel Solution for Realizing III-V CMOS," 2012 Symposium on VLSI Technology (VLSIT), pp. 185-186.

* cited by examiner

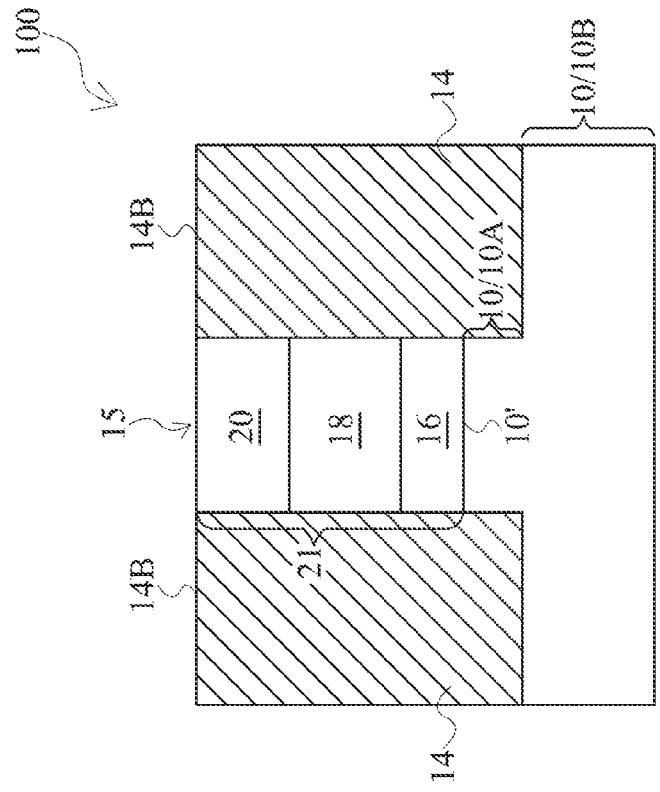
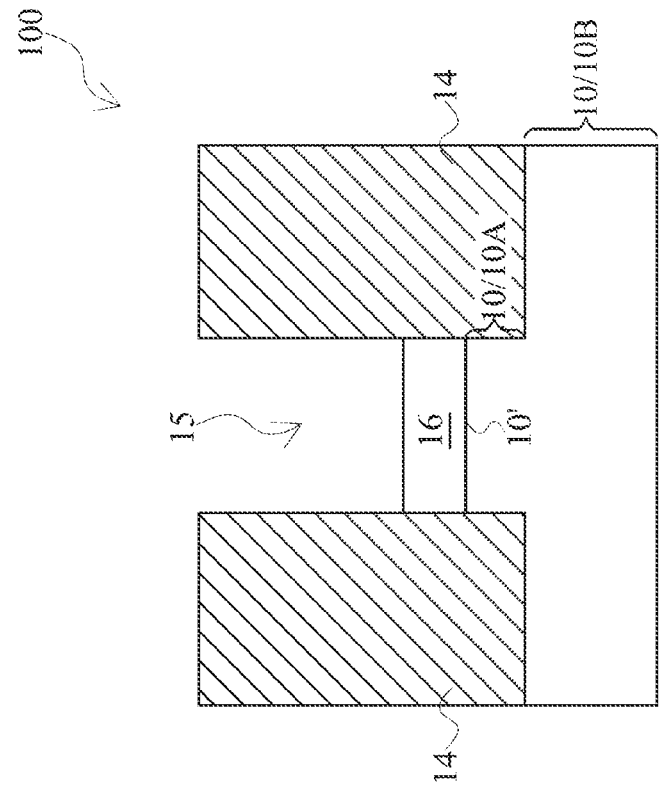

METHODS OF FORMING SEMICONDUCTOR DEVICES AND FINFET DEVICES, AND FINFET DEVICES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area.

Multiple gate field-effect transistors (MuGFETs) are a recent development in semiconductor technology which typically are metal oxide semiconductor FETs (MOSFETs) that incorporate more than one gate into a single device. One type of MuGFET is referred to as a fin-FET (FinFET), which is a transistor structure with a fin-like semiconductor channel that is raised vertically out of the silicon surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 6 illustrate cross-sectional views of a method of forming a fin field effect transistor (FinFET) at various stages of manufacturing in accordance with some embodiments of the present disclosure.

DETAILED DESCRIPTION

Figure 2:
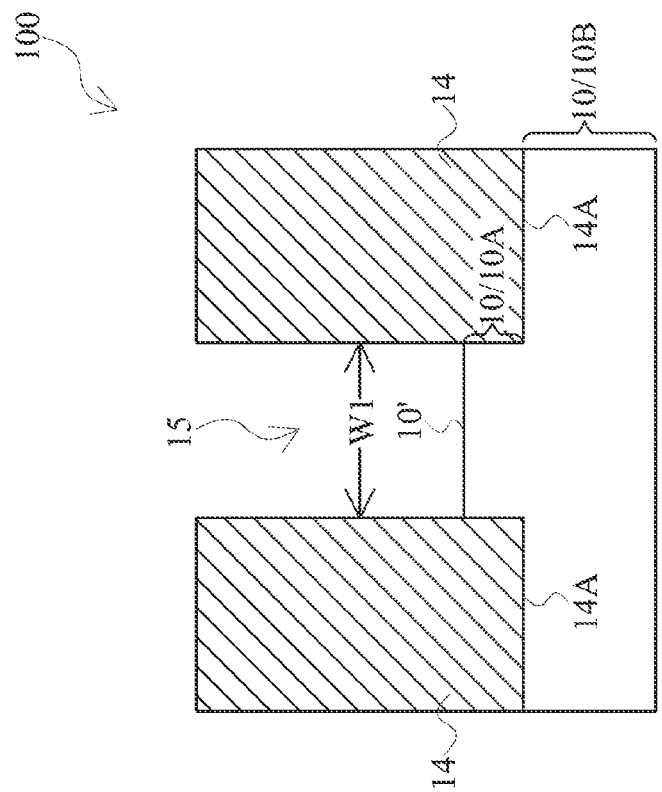

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure provide novel methods of forming semiconductor devices and FinFETs, and structures thereof. In some embodiments, a barrier material comprises AlInAsSb. A channel region of a transistor is formed over or grown from the barrier material. Some embodiments of the present disclosure may also be implemented in planar transistors.

Figure 1:
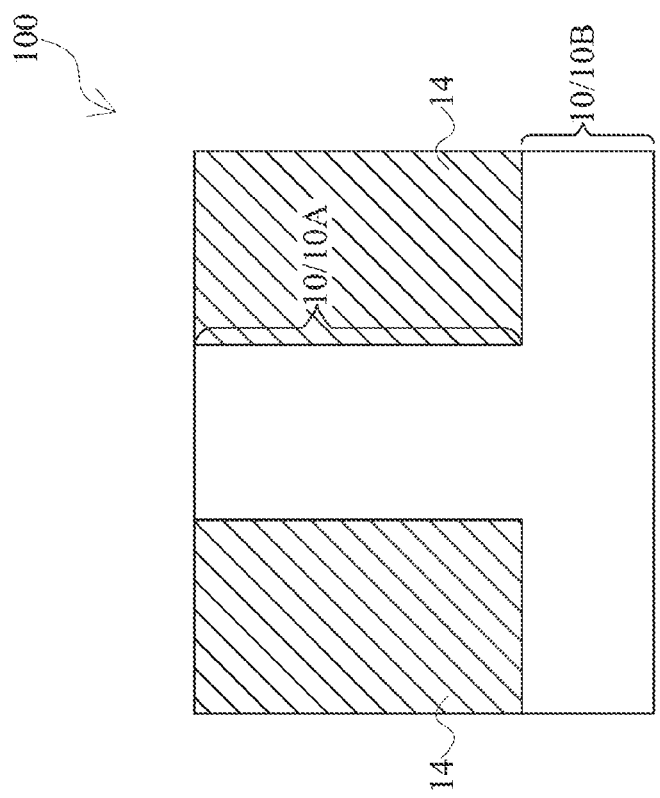

FIGS. 1 through 6 illustrate cross-sectional views of a method of forming a fin field effect transistor (FinFET) device at various stages of manufacturing in accordance with some embodiments of the present disclosure. Referring to FIG. 1, a semiconductor device 100 is shown that includes a substrate 10. To manufacture the semiconductor device 100, first, the substrate 10 is provided. The substrate 10 is part of a semiconductor wafer in some embodiments; e.g., a plurality of semiconductor devices 100 are fabricated on a semiconductor wafer, and the wafer is later singulated along scribe lines. Only one FinFET is shown in each of the drawings; however, a semiconductor device 100 may include dozens, hundreds, or thousands of FinFETs formed across a surface thereon, in some embodiments, for example.

The substrate 10 may include a semiconductor substrate comprising silicon (Si) or other semiconductor materials. The substrate 10 may, or may not be, covered by an insulating layer, for example. The substrate 10 may include active components or circuits, not shown. The substrate 10 may comprise silicon oxide over single-crystal silicon, for example. The substrate 10 may include conductive layers or semiconductor elements, e.g., transistors, diodes, etc., formed therein. The substrate 10 may comprise a single-crystalline Si or germanium (Ge) substrate in some embodiments. In some embodiments, the substrate 10 comprises Si oriented in a (0,0,1) crystalline orientation, as an example. Compound semiconductors such as GaAs, InP, SiGe, SiC, InAs, or GaSb, as examples, may be used in place of Si or Ge. The substrate 10 may comprise a bulk substrate or a semiconductor-on-insulator (SOI) substrate, for example. Alternatively, the substrate 10 may comprise other materials and crystalline orientations.

A plurality of isolation regions such as shallow trench isolation (STI) regions 14 are formed in the substrate 10. The isolation regions may comprise other types of isolation structures, such as field oxide regions, for example. The substrate 10 thus includes region 10A disposed between two of the STI regions 14, and region 10B disposed under or beneath the STI regions 14. The formation process of the STI regions 14 may include etching the substrate 10 to form recesses (which are occupied by STI regions 14 in FIG. 1), filling the recesses with a dielectric material(s) such as silicon oxide, silicon nitride, other insulating materials, or combinations or multiple layers thereof, and performing a planarization process to remove excess dielectric material from the top surface of the substrate 10. The remaining portions of the dielectric material(s) left residing in the recesses form the STI regions 14.

Next, as shown in FIG. 2, a portion of the substrate 10 between two of the STI regions 14 is recessed. For example, a top portion of region 10A of substrate 10 is removed, which region 10A is disposed between opposite sidewalls of the two STI regions 14. The top portion of region 10A is removed using an etch process to form a trench 15. In some embodiments, a top surface 10' of the substrate 10, which top surface 10' is exposed to the trench 15, is substantially level with bottom surfaces 14A of the STI regions 14. In other embodiments, the top surface 10' of region 10A of the substrate 10 is higher than or lower than the bottom surfaces 14A of the STI regions 14 after the etch process used to form the trench 15. The etch process may be performed using a dry etch, with the etching gas being selected from $CF_4$, $Cl_2$, $NF_3$, $SF_6$, and/or combinations thereof. In alternative embodiments, the etch process may be performed using wet etching, for example, using Tetra-Methyl Ammonium Hydroxide (TMAH), a potassium hydroxide (KOH) solution, or the like, as an etchant. In the resulting structure, the trench 15 may have a width W1 that comprises about 150 nm or less, for example. Alternatively, the width W1 may comprise other values. In some embodiments, the width W1 of the trench 15 may be between about 10 nm and about 100 nm. It is appreciated, however, that the values recited throughout the description are merely examples, and may be changed to different values.

In some embodiments, after region 10A of the substrate 10 is recessed, a template material 16 is formed over the substrate 10, as shown in FIG. 3. The template material 16 comprises about 10 nm to about 100 nm of a group III-V material in some embodiments, for example. In some embodiments, the template material 16 comprises about 5 nm to about 80 nm of InAs, InSb, GaAs, InP, GaP, GaSb, AlSb, a combination thereof, or multiple layers thereof, as examples. In some embodiments, the template material 16 comprises a thickness of about 40 nm, for example. Alternatively, the template material 16 may comprise other materials and dimensions.

In some embodiments, the template material 16 is formed over the substrate 10 using an epitaxial growth process, by introducing fluxes of In or Ga and As, P, or Sb into a chamber that the semiconductor device 100 is being processed in, for example. The template material 16 may alternatively be formed using atomic layer deposition (ALD), as another example. The template material 16 may also be formed by introducing other fluxes or by using other methods.

The template material 16 is then deoxidized in some embodiments. The template material 16 may be deoxidized by heating the semiconductor device 100 in the presence of an As or P flux, for example. The template material 16 may be deoxidized by heating the semiconductor device 100 at a temperature of about 500 degrees C. to about 600 degrees C., for example. The template material 16 may be deoxidized by heating the semiconductor device 100 at a temperature of about 550 degrees C. in some embodiments, for example. Alternatively, the template material 16 may be deoxidized by heating the semiconductor device 100 at other temperatures and in the presence of other fluxes or without the presence of a flux.

In some embodiments, the surface of the template material 16 is monitored while deoxidizing the template material 16, to ensure a stable surface reconstruction of the template material 16. The surface of the template material 16 may be monitored using reflection high-energy electron diffraction (RHEED) or other methods, for example.

The template material 16 is adapted to absorb lattice mismatches with the material of the underlying substrate 10 in some embodiments, for example.

A barrier material 18 is then formed over the template material 16, as shown in FIG. 4. The barrier material 18 comprise AlInAsSb in some embodiments. The barrier material 18 is formed by introducing fluxes of $As_2$, Sb, In, and Al at a temperature of about 450 degrees C. to about 560 degrees C. in some embodiments, for example. The barrier material 18 is formed at a temperature of about 520 degrees C. in some embodiments, for example. The barrier material 18 comprises about 0.5% to about 15% of In in some embodiments. The barrier material 18 comprises a thickness of about 4 nm to about 80 nm in some embodiments. The barrier material 18 comprises a thickness of about 50 nm in some embodiments, for example. Alternatively, the barrier material 18 may comprise other materials, dimensions, formation methods, and other amounts of In. The barrier material 18 comprises a seed layer for an epitaxial growth process of a subsequently formed material layer, such as a channel material in some embodiments, for example. The barrier material 18 comprises a lattice that is substantially matched to the material of the template material 16 in some embodiments, for example.

Next, a channel material 20 is formed over the barrier material 18, also shown in FIG. 4. The channel material 20 comprises a channel region of transistor, for example. The channel material 20 is disposed over the barrier material 18 within the trench 15. In some embodiments, precursors are introduced into the chamber so that the channel material 20 is epitaxially grown from the barrier material 18, for example. The channel material 20 may comprise about 3 nm to about 40 nm of a high mobility conductive or semiconductive material in some embodiments, such as InAs, InGaAs, GaSb, InGaSb, InSb, or combinations or multiple layers thereof, as examples. Some precursors used to epitaxially grow the channel material 20 include precursors including In, As, Ga, and/or Sb, as examples. In some embodiments, the channel material 20 comprises a thickness of about 10 nm, for example. In some embodiments, the channel material 20 comprises InAs that is grown using fluxes of $As_2$ and In at a temperature of about 500 degrees C. Alternatively, the channel material 20 may comprise other dimensions and materials, and may be formed using other precursors or temperatures, or other methods.

The channel material 20 is more uniform due to the inclusion of the novel barrier material 18. The barrier material 18 comprising AlInAsSb decreases or eliminates wet etch defects and provides improved device to device thickness uniformity in some embodiments, for example. Furthermore, the electrical insulating properties are more robust under a thermal budget of up to about 300 degrees C. by the inclusion of In in the barrier material 18, which transforms the barrier material 18. The inclusion of the In in the AlAsSb of the barrier material 18 eliminates point defects in the barrier material 18, making the barrier material 18 more robust in factors such as improved insulating properties, a more uniform thickness, and fewer etch defects, as examples.

The template material 16, the barrier material 18, and the channel material 20 comprise a semiconductor region 21 that is epitaxially grown within the trench 15 disposed between the STI regions 14 in some embodiments. In some embodiments, the barrier material 18 comprises a seed layer for an epitaxial growth process for the channel material 20, for example.

The epitaxial growth of the channel material 20 may be continued until the top surface of semiconductor region 21 is higher than top surfaces 14B of the STI regions 14 in some embodiments. A planarization is then performed. The planarization may comprise a chemical mechanical polish (CMP) or other process. The planarization may be continued until no portion of the channel material 20 is left overlapping the STI regions 14 (e.g., until the top surface of the channel material 20 is coplanar with the top surface 14B of the STI regions 14). In alternative embodiments, the epitaxy process is stopped when the top surface of channel material 20 is substantially level with, or lower than, the top surfaces 14B of the STI regions 14. In these embodiments, the planarization step may then be performed, or the planarization step may not be performed.

Figure 6:
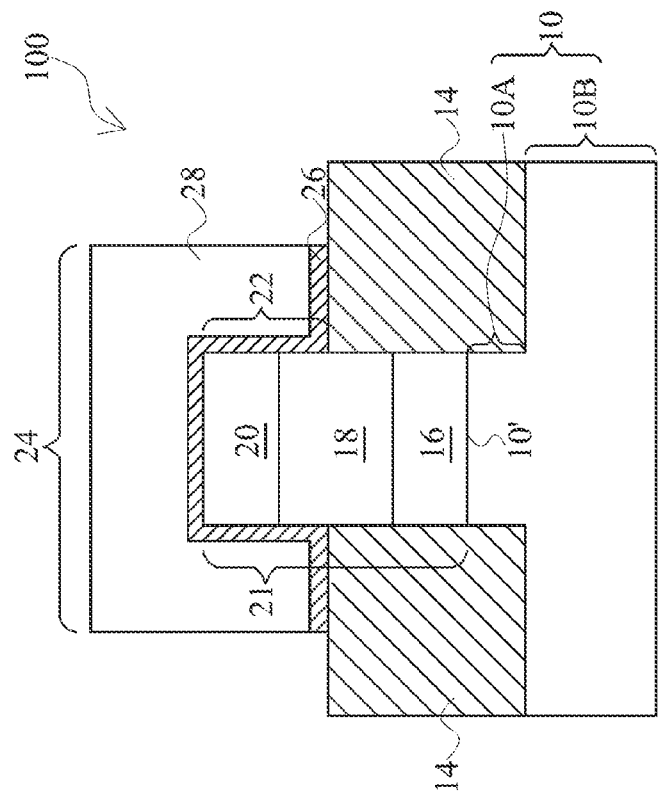
Figure 5:
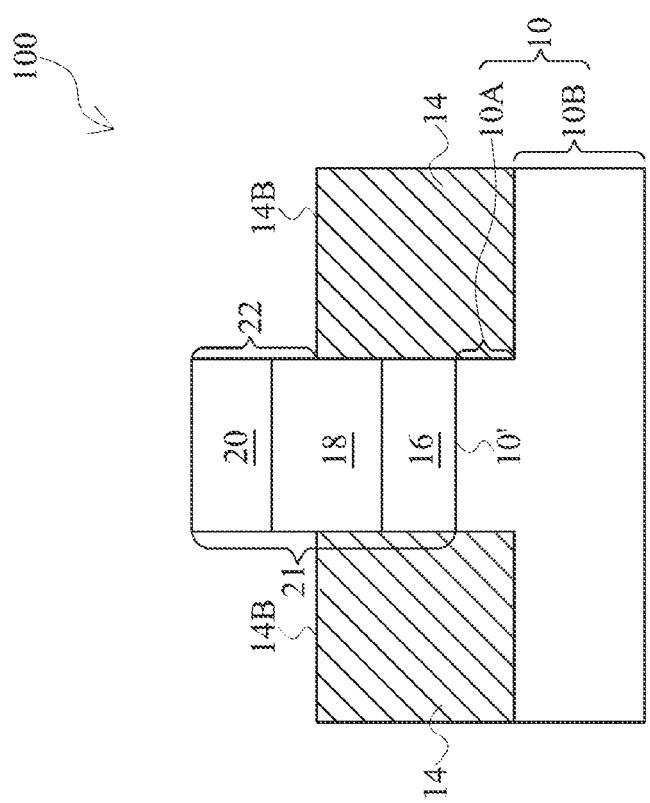

Referring next to FIG. 5, the STI regions 14 are recessed, for example, using an etching process. A portion of the semiconductor region 21 is thus higher than the top surfaces 14B of the STI regions 14. The channel material 20 and a portion of the barrier material 18 is higher than the top surfaces 14B of the STI regions 14 in FIG. 5, for example. This portion of the semiconductor region 21 forms a semiconductor fin 22, which may be used to form a FinFET device 24, as shown in FIG. 6. In some embodiments, at least a portion of the channel material 20 over top surfaces 14B of remaining portions of the STI regions 14 forms a semiconductor fin 22, for example.

Referring to FIG. 6, a gate dielectric 26 and a gate electrode 28 are formed. The gate dielectric 26 is formed on sidewalls and a top surface of the semiconductor fin 22. The gate dielectric 26 may comprise a dielectric material such as silicon oxide, silicon nitride, an oxynitride, multi-layers thereof, and/or combinations thereof. The gate dielectric 26 may also comprise high dielectric constant (k) dielectric materials, for example. Some exemplary high-k materials may have k values of greater than about 4.0, or greater than about 7.0. The gate electrode 28 is formed over the gate dielectric 26. The gate electrode 28 may be formed of doped polysilicon, metals, metal nitrides, metal silicides, and the like. The bottom ends of the gate dielectric 26 may contact the top surface of STI regions 14. The gate electrode 28 and the gate dielectric 26 may be patterned using a lithography process. After the formation of the gate dielectric 26 and the gate electrode 28, source and drain regions (not in the illustrated plane) may be formed to finish the formation of the FinFET device 24.

The FinFET device 24 advantageously has improved device performance due to the inclusion of the novel barrier material 18 comprising AlInAsSb. The barrier material 18 is unstrained and has a sufficient conduction band (CB) offset, is thermally stable, defect-free, provides good electrical isolation, and is robust during processing. The barrier material 18 is quaternary and provides a lattice match to the subsequently formed channel material 20, resulting in a more uniform channel material 20.

Figure 7:
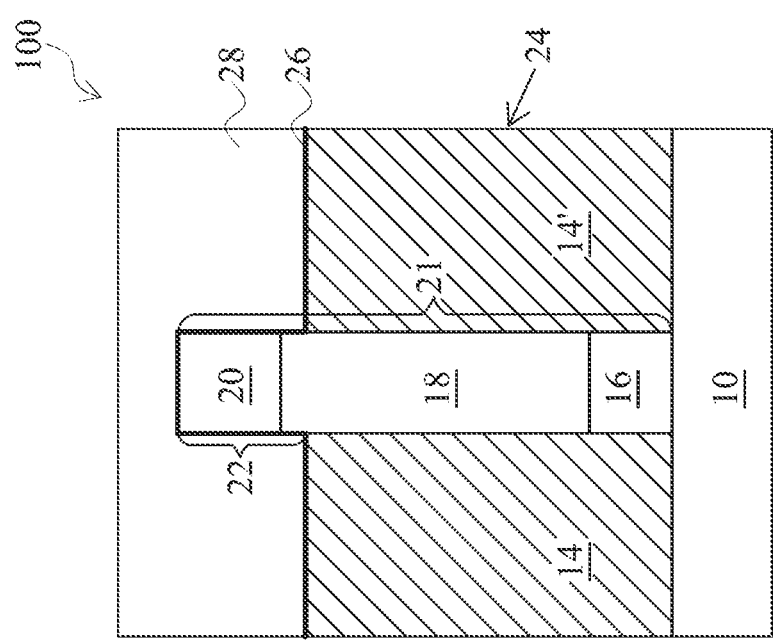
FIG. 7 is a cross-sectional view of a semiconductor device including a FinFET device in accordance with some embodiments.

FIG. 7 is a cross-sectional view of a semiconductor device 100 including a FinFET device 24 in accordance with some embodiments. The semiconductor region 21 including the template material 16, the barrier material 18, and the channel material 20 may comprise slightly tapered sidewalls in some embodiments, being wider proximate the bottom than proximate the top of the semiconductor region 21. The semiconductor device 100 includes a first STI region 14 on a first side of the semiconductor fin 22 (and also semiconductor region 21), and a second STI region 14' on a second side of the semiconductor fin 22, the second side being opposite the first side. At least a portion of the channel material 20 of the semiconductor fin 22 is disposed above top surfaces of the first STI region 14 and the second STI region 14'.

Embodiments of the present disclosure are implementable in FinFETs comprising n channel FETs (NFETs) or p channel FETs (PFETs). The material choices for the template material 16 and the channel material 20 may be selected that are suitable for the NFETs and the PFETs, with the inclusion of the barrier material 18 comprising AlInAsSb. For example, for an NFET, the template material 16 may comprise InAs, and the channel material 20 may comprise InAs or InGaAs in some embodiments. As another example, for an NFET or a PFET, the template material 16 may comprise InAs, and the channel material 20 may comprise GaSb or InGaSb in some embodiments. As yet another example, for an NFET, the template material 16 may comprise InSb, and the channel material 20 may comprise InSb, in some embodiments. Other material combinations may alternatively be used for the template material 16 and the channel material 20.

Figure 8:
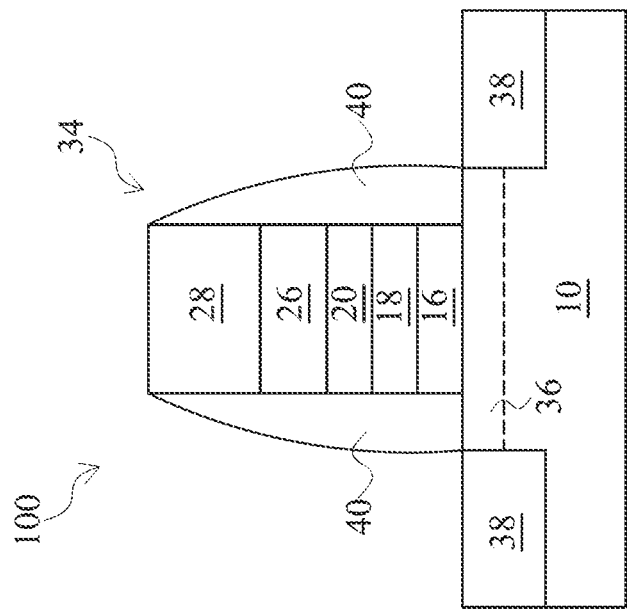
FIG. 8 is a cross-sectional view of a semiconductor device including a planar transistor in accordance with some embodiments.

Embodiments of the present disclosure are also implementable in planar transistors 34, as shown in FIG. 8 in a cross-sectional view. The template material 16, the barrier material 18, and the channel material 20 may be sequentially formed over a planar substrate 10, and a gate dielectric 26 and gate electrode 28 material are formed over the channel material 20. Alternatively, the template material 16, the barrier material 18, and the channel material 20 may be formed within an upper region 36 of the substrate 10, e.g., by recessing the substrate 10 and forming the template material 16, the barrier material 18, and the channel material 20 over the recessed substrate 10. The gate electrode 28 material and gate dielectric 26, and also the template material 16, the barrier material 18, and the channel material 20 in some embodiments, are patterned using lithography, and sidewall spacers 40 are formed over the sidewalls of the gate electrode 28 and gate dielectric 26, and also over sidewalls of the template material 16, the barrier material 18, and the channel material 20, in some embodiments. The sidewall spacers 40 may be formed by depositing a substantially conformal dielectric material such as silicon oxide, silicon nitride, other insulating materials, or combinations or multiple layers thereof, and etching the dielectric material using an anisotropic etch process, which removes the dielectric material preferentially from top surfaces yet leaves the dielectric material remaining on sidewalls of at least the gate electrode 28 and the gate dielectric 26. Source and drain regions 38 are formed within the substrate 10 proximate the sidewall spacers 40, using an implantation process, epitaxial growth process, and/or deposition process.

Figure 9:
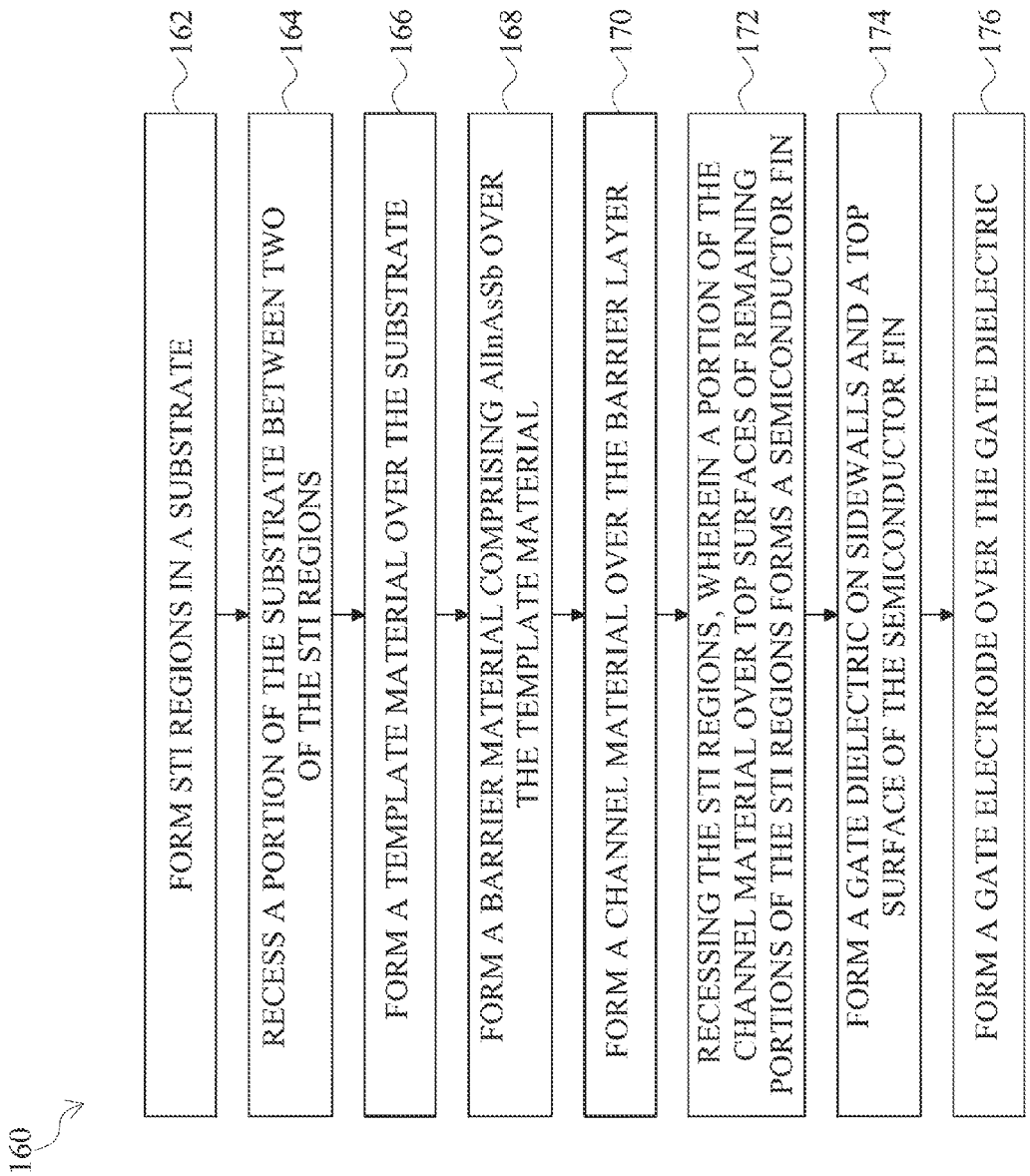
FIG. 9 is a flow chart of a method of manufacturing a FinFET in accordance with some embodiments.

FIG. 9 is a flow chart 160 of a method of manufacturing a FinFET device 24 in accordance with some embodiments. In step 162, STI regions 14 (see also FIG. 1) are formed in a substrate 10. In step 164, a portion of the substrate 10 is recessed between two of the STI regions 14 (FIG. 2). In step 166, a template material 16 is formed over the substrate 10 (FIG. 3). In step 168, a barrier material 18 comprising AlInAsSb is formed over the template material 16 (FIG. 4). In step 170, a channel material 20 is formed over the barrier material 18. In step 172, the STI regions 14 are recessed, wherein a portion of the channel material over top surfaces of remaining portions of the STI regions forms a semiconductor fin 22 (FIG. 5). In step 174, a gate dielectric 26 is formed on sidewalls and a top surface of the semiconductor fin 22 (FIG. 6). In step 176, a gate electrode 28 is formed over the gate dielectric 26.

Some embodiments of the present disclosure include methods of forming semiconductor devices 100, and also include methods of forming FinFET devices 24. Other embodiments include FinFET devices 24 and semiconductor devices 100 manufactured using the methods described herein.

Advantages of some embodiments of the present disclosure include providing novel methods of forming transistors that include a novel barrier material 18 that comprises a quaternary material that includes In. The barrier material 18 comprising AlInAsSb may be implemented in FinFETs or planar transistors. The barrier material functions as a wide-bandgap barrier for the subsequently formed channel material in some embodiments, for example.

The transistors and FinFETs advantageously have improved device performance due to the inclusion of the novel barrier material comprising AlInAsSb. The barrier material is unstrained and has a sufficient CB offset, and is thermally stable even at higher temperatures. The barrier material is defect-free in some embodiments, has good electrical isolation, and is robust during processing. The electrical insulating properties of the barrier material are robust under a thermal budget of up to about 300 degrees C. in some embodiments, enabling the use of a high-k last process (e.g., a subsequent deposition process of a high k material, for example).

The barrier material has a low density of defect points, which reduces or eliminates wet etch defects, for example. Including a small amount of In in the AlInAsSb barrier material 18 advantageously decreases or eliminates point defects without significantly reducing the CB offset, and also prevents extensive oxidation of the sidewalls of the barrier material. The barrier material provides a lattice match to the subsequently formed channel material, resulting in a more uniform channel material. Channel materials grown from the barrier material comprising AlInAsSb have a more uniform thickness from device to device, for example.

Some embodiments of the present disclosure are particularly useful when implemented in NFET devices that have InAs channel materials, for example. Some embodiments are beneficial when implemented in group III-V FinFET devices and group III-V FinFET devices wherein material layers are grown by selective area growth (SEG) and aspect ratio trapping (ART) epitaxy, as other examples. Furthermore, the methods described herein are easily implementable in semiconductor device and FinFET device manufacturing process flows.

In some embodiments, a method of forming a semiconductor device includes forming a barrier material comprising AlInAsSb over a substrate, and forming a channel material of a transistor over the barrier layer.

In other embodiments, a method of forming a FinFET device includes forming STI regions in a substrate, recessing a portion of the substrate between two of the STI regions, and forming a template material over the substrate. The method includes forming a barrier material comprising AlInAsSb over the template material, and forming a channel material over the barrier layer. The STI regions are recessed, wherein a portion of the channel material over top surfaces of remaining portions of the STI regions forms a semiconductor fin. A gate dielectric is formed on sidewalls and a top surface of the semiconductor fin, and a gate electrode is formed over the gate dielectric.

In other embodiments, a FinFET device includes a substrate, a template material disposed over the substrate, and a barrier material comprising AlInAsSb disposed over the template material. A channel material is disposed over the barrier material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a template material over a substrate;
    forming a barrier material comprising AlInAsSb over the template material after deoxidizing the template material; and
    forming a channel material of a transistor over the barrier material,
    wherein a lower surface of the template material contacts the substrate, and an upper surface of the template material opposing the lower surface contacts the barrier material, wherein the template material extends continuously without an interface from the substrate to the barrier material.

2. The method according to claim 1, wherein forming the barrier material comprises forming a barrier material comprising about 0.5% to about 15% of In.

3. The method according to claim 1, wherein forming the barrier material comprises forming a barrier material comprising a thickness of about 4 nm to about 80 nm.

4. The method according to claim 1, wherein forming the channel material comprises forming a channel material comprising a thickness of about 3 nm to about 40 nm.

5. The method according to claim 1, wherein forming the template material comprises forming a template material comprising a thickness of about 10 nm to about 100 nm.

6. The method according to claim 1, wherein forming the channel material comprises epitaxially growing the channel material, and wherein the barrier material comprises a seed layer for the epitaxial growth of the channel material.

7. The method according to claim 1, wherein forming the channel material comprises forming a channel of a planar transistor or a fin field effect transistor (FinFET).

8. The method according to claim 1, wherein forming the template material comprises forming the template material using a group III-V material.

9. The method according to claim 1, wherein a lattice of the barrier material is substantially matched to a lattice of the template material.

10. A method of forming a fin field effect transistor (FinFET) device, the method comprising:
    forming shallow trench isolation (STI) regions in a substrate;
    recessing a portion of the substrate between two of the STI regions;
    forming a template material over the substrate;
    forming a barrier material comprising AlInAsSb over the template material after deoxidizing the template material, wherein the deoxidizing comprises heating the template material in the presence of an As or P flux;
    forming a channel material over the barrier material;
    recessing the STI regions, wherein a portion of the channel material disposed over top surfaces of remaining portions of the STI regions forms a semiconductor fin;
    forming a gate dielectric on sidewalls and a top surface of the semiconductor fin; and
    forming a gate electrode over the gate dielectric.

11. The method according to claim 10, wherein deoxidizing the template material comprises heating the FinFET device at a temperature of about 500 degrees C. to about 600 degrees C.

12. The method according to claim 10, further comprising monitoring the surface of the template material while deoxidizing the template material to ensure a stable surface reconstruction of the template material.

13. The method according to claim 12, wherein monitoring the surface of the template material comprises using reflection high-energy electron diffraction (RHEED).

14. The method according to claim 10, wherein forming the barrier material comprises introducing fluxes of $As_e$, Sb, In, and Al at a temperature of about 450 degrees C. to about 560 degrees C.

15. A method of forming a semiconductor device, the method comprising:

forming a template material over a substrate, the template material absorbing lattice mismatches with the substrate;

epitaxially forming a barrier material over the template material, the barrier material having a lattice that is matched to the template material;

epitaxially forming a channel material over the barrier material using the barrier material as a seed layer, the channel material comprising a high mobility conductive or semiconductive material;

forming a gate dielectric over the channel material; and forming a gate electrode over the gate dielectric.

16. The method according to claim 15, wherein the barrier material comprises In and is free of point defects.

17. The method according to claim 15, wherein the barrier material comprises AlInAsSb.

18. The method according to claim 15, wherein the channel material comprises a material selected from the group consisting of InAs, InGaAs, GaSb, InGaSb, InSb, and combinations thereof.

19. The method accordingly to claim 15, further comprising:

deoxidizing the template material before the epitaxially forming the barrier material.

20. The method according to claim 19, wherein the deoxidizing the template material is performed in the presence of an As or P flux.

* * * * *